(12) United States Patent
Kato et al.

(10) Patent No.: US 6,472,330 B1
(45) Date of Patent: Oct. 29, 2002

(54) METHOD FOR FORMING AN INTERLAYER INSULATING FILM, AND SEMICONDUCTOR DEVICE

(75) Inventors: Toshio Kato, Tokyo (JP); Noboru Tokumasu, Tokyo (JP); Makoto Kurotobi, Tokyo (JP); Taizo Oku, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/572,258

(22) Filed: May 17, 2000

(30) Foreign Application Priority Data

Sep. 6, 1999 (JP) .......................................... 11-162917

(51) Int. Cl.[7] .......................................... H01L 21/302
(52) U.S. Cl. .................. 438/712; 438/720; 438/723; 438/724
(58) Field of Search ................. 438/706, 708, 438/709, 720, 723, 724, 725, 745, 754, 712

(56) References Cited

U.S. PATENT DOCUMENTS

| 5,256,247 A | * 10/1993 | Watanabe et al. ............. 216/16 |
| 5,834,827 A | * 11/1998 | Miyasaka et al. ........... 257/578 |
| 5,930,669 A | * 7/1999 | Uzoh ......................... 438/627 |
| 6,160,316 A | * 12/2000 | Gardner et al. ............. 257/773 |

* cited by examiner

*Primary Examiner*—Robert Kunemund
*Assistant Examiner*—Binh X. Tran
(74) *Attorney, Agent, or Firm*—Lorusso & Loud

(57) ABSTRACT

A method for forming an interlayer insulating film includes the steps of: forming a metal film on a substrate; forming a first insulating film on the metal film; patterning the first insulating film by selectively etching the first insulating film; patterning the metal film by etching the metal film using the patterned first insulating film as a mask; forming an overhang portion of the first insulating film on the metal film by selectively etching a side portion of the metal film; and forming a second insulating film on the entire structure.

9 Claims, 4 Drawing Sheets

METHOD FOR FORMING AN INTERLAYER INSULATING FILM, AND SEMICONDUCTOR DEVICE

BACKGROUND OF THE INVENTION

The present invention relates to a method for forming an interlayer insulating film which electrically insulates a wiring from other wirings in a semiconductor device, more particularly to a method for forming an interlayer insulating film showing a low dielectric constant, which reduces the electric capacitance between the wirings.

Recently, high integration and high densification of semiconductor devices such as LSI have progressed by reducing the spacing between the wirings in the semiconductor device. As the spacing between the wirings becomes narrower, electrical capacitance between the wirings becomes larger and processing speed of the semiconductor device becomes slower. To overcome such a problem, a film showing a low dielectric constant must be used as an interlayer insulating film between the wirings, and development of such an interlayer insulating film showing a low dielectric constant is an urgent need.

The interlayer insulating film that has been used most widely is an $SiO_2$ film, and its relative dielectric constant is 4.0. Interlayer insulating films showing a lower relative dielectric constant than that of an $SiO_2$ film include an FSG film obtained by adding F (fluorine) to $SiO_2$, a HSQ (Hydrogen Silsequioxiane) film of an inorganic SOG (Spin On Glass), and an organic polymer film. Next, these films will be briefly described.

FSG Film

There are several methods to form the FSG film, and a formation method using a helicon wave plasma CVD apparatus will be described in this specification (see Semiconductor World (Monthly), February 1996, p.82 to p.85). In this method, $SiH_4$, $O_2$, Ar and $SiF_4$ are used as source gases. Among these source gases, $SiF_4$ is used for adding fluorine (F) to $SiO_2$. Process conditions using these source gases are as follows.

gas flow rate: $SiF_4+SiH_4=70$ (sccm)
$SiF_4/SiH_4=1.0$
$O_2/(SiF_4+SiH_4)=1.0$
Ar=70 (sccm)
power of helicon wave plasma: 2500 (W)
bias power: 2000 (W)
temperature: 400 (° C.)

The relative dielectric constant of the FSG film formed under these process conditions is at least about 3.1, which value is smaller than the 4.0 relative dielectric constant of an $SiO_2$ film most generally used.

HSQ Film

HSQ is inorganic polymer of $HSiO_{1.5}$, and contains hydrogen, thus showing a low relative dielectric constant of about 2.9.

Other Films

In addition to the FSG film and HSQ film, films of Teflon group and other organic polymers have been studied. However, these films showing low relative dielectric constants have the following problems.

HSQ Film

The HSQ film shows poor stability in a thermal annealing process and, when oxygen, nitrogen and the like touch the surface of the film, its dielectric constant decreases. A graph showing the relationship between the time of annealing the HSQ film and its dielectric constant is shown in FIG. 1.

Other Films

The films of the Teflon group show poor adhesion to a $SiO_2$ film, and they tend to peel off from the $SiO_2$ film during Chemical Mechanical Polishing (CMP).

Since the films of the organic polymer group show an etching rate approximately equal to that of resist for a mask member, it is difficult to etch them. These organic polymer films have a problem that when this resist is subjected to $O_2$ down-flow-ashing, the film of the organic polymer formed under the resist is damaged by oxygen $O_2$, and the dielectric constant of the film is increased.

SUMMARY OF THE INVENTION

The object of the present invention is to provide a method for forming a new interlayer insulating film showing a low dielectric constant, which is different from the above-described films, and a semiconductor device fabricated by use of this method.

According to the method for forming an interlayer insulating film of the present invention, a side portion of a patterned metal film is selectively etched. Thus, overhung portions of a first insulating film on the metal film are formed, and then a second insulating film is formed over the entire structure.

When the spacing between wirings is narrowed, a gap between overhung portions formed on the wirings is also narrowed. For this reason, a source gas for forming the second insulating film will hardly enter a concave portion defined by side surfaces of two adjacent wirings and the a surface of a substrate. Thus, the second insulating film is not sufficiently formed in this concave portion, and the result is a cavity in the concave portion.

The dielectric constant of the cavity formed in such manner is apparently smaller than that of the second insulating film. Accordingly, the dielectric constant of the narrow spacing between the wirings become smaller compared to the case where that spacing is fully filled with the second insulating film.

In the method for forming an interlayer insulating film of the present invention, a SiN film is used as a first insulating film. The SiN film is formed by a plasma enhanced chemical vapor deposition method using $SiH_4$ and $NH_3$ as source gases. The inventors of the present application found out that the overhung portion of the SiN film can be easily formed by setting a flow rate ratio $SiH_4/NH_3$ to be larger than 1.0. The reason for this is that the SiN film formed in this manner is hardly affected during etching of the patterned metal film.

Instead of the above SiN film, a Diamond Like Carbon (DLC) film can be used as a first insulating film. According to measurement carried out by the inventors of the present application, the dielectric constant of the DLC film containing many air bubbles therein is about 2.4 to 2.7, which is smaller than the dielectric constant (about 7.0) of the SiN film. Accordingly, the use of the DLC film enables the dielectric constant of the entire film to be smaller than that of a SiN film used as a first insulating film. Furthermore, compared with the SiN film, the DLC film is more stable physically and chemically. Thus, during etching of the side portion of a patterned metal film, the DLC film is hardly etched, and a overhung portion of the DLC Film and a cavity can be easily formed. As a result, electric capacitance between wirings can be further reduced compared with the case using the SiN film as a first insulating film.

Furthermore, instead of the above SiN and DLC films, an $SiO_2$ film may be used as a first insulating film. A process for forming the $SiO_2$ film has been well established and, accordingly, the SiO$_2$ film as a first insulating film of the present invention can be easily formed by using an existing film forming apparatus. Since the SiO$_2$ film contains little moisture during film formation, as compared with the SiN film, wirings formed under it are hardly affected by moisture. Moreover, the dielectric constant of the SiO$_2$ film is about 4.0, which is smaller than the dielectric constant (about 7.0) of the SiN film. As a result, the use of the SiO$_2$ film as a first insulating film enables the dielectric constant of the entire film to be smaller than that of the case using the SiN film as a first insulating film.

BRIEF DESCRIPTION OF THE DRAWINGS

For a more complete understanding of the present invention and advantages thereof, reference is now made to the following description taken in conjunction with the accompanying drawings, in which.

DETAILED DESCRIPTION OF THE PREFERRED EMBODIMENTS

Next, the preferred embodiments of the present invention will be described with reference to the accompanying drawings.

(1) First Embodiment

FIGS. 2A to 2J are sectional views illustrating a first embodiment.

Figure 1:
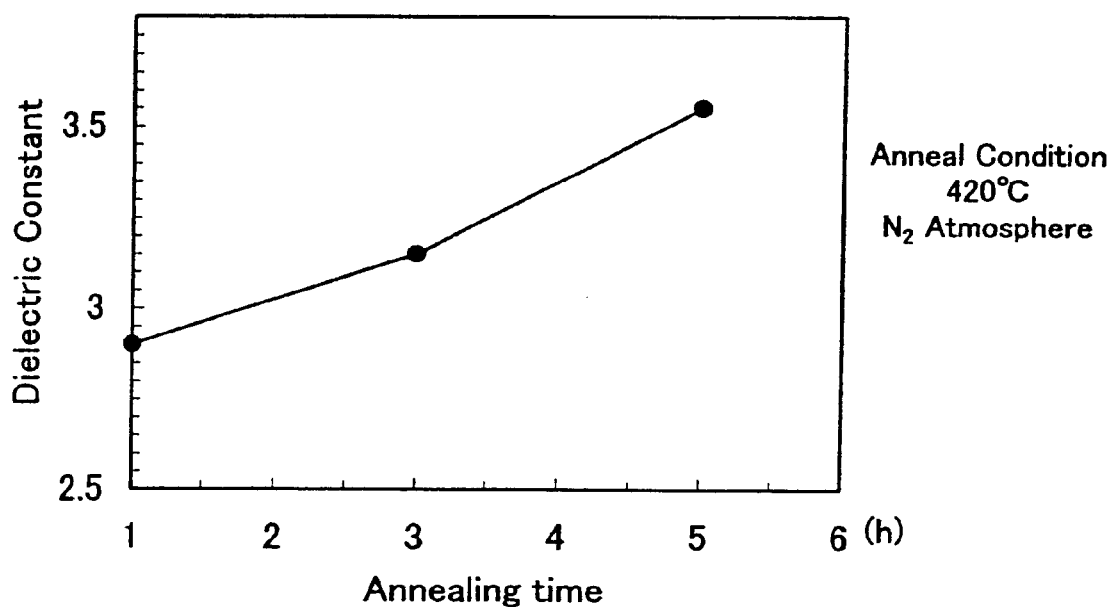
FIG. 1 is a graph showing the relationship between time of annealing of a HSQ film and its dielectric constant in a conventional example.
Figure 2A:
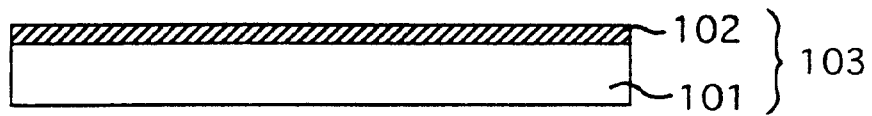
FIGS. 2A to 2J are sectional views showing methods for forming interlayer insulating films according to first and second embodiments of the present invention.

First, as shown in FIG. 2A, a BPSG film 102 is formed on a silicon substrate 101. These constitute a substrate 103.

Figure 2B:
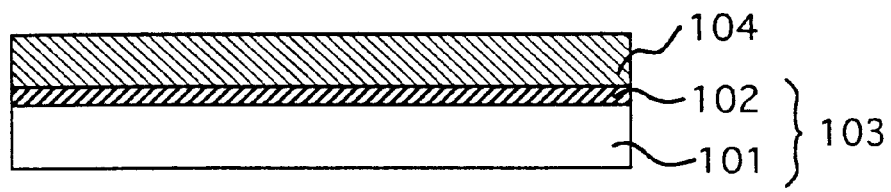

Then, as shown in FIG. 2B, an aluminum film 104 (metal film) is formed on the substrate 103 by a Physical Vapor Deposition method (PVD method). This aluminum film 104 is used later as wiring, and its film thickness is set in a range of 5000 Å to 10000 Å.

Figure 2C:
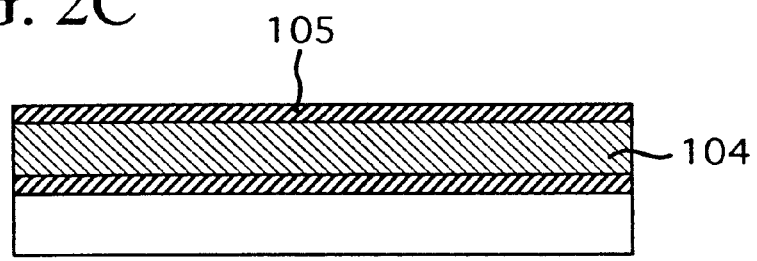

Subsequently, as shown in FIG. 2C, a SiN film 105 (first insulating film) is formed on the aluminum film 104. This SiN film 105 is formed by a plasma enhanced Chemical Vapor Deposition method (CVD method), and its film thickness is set equal to 1000 Å or less. Source gases used for forming the SiN film 105 are SiH$_4$ and NH$_3$, or SiH$_4$ and N$_2$.

Instead of the SiN film 105, an SiO$_2$ film can be used as the first insulating film. In this case, the SiO$_2$ film informed by the plasma enhanced CVD method that uses SiH$_4$ and N$_2$O, or SiH$_4$ and O$_2$ as source gases. Since the SiO$_2$ film formed in such a manner has a smaller moisture content than the SiN film, the aluminum film 104 formed under same is not affected by moisture.

Also, instead of the SiN film 105, a PSG film or an FSG film can be used as a first insulating film. Especially, since the FSG film has a low dielectric constant, the use of this FSG film as a first insulating film enables the dielectric constant of an interlayer insulating film formed in a manner described below to be reduced.

Figure 2D:
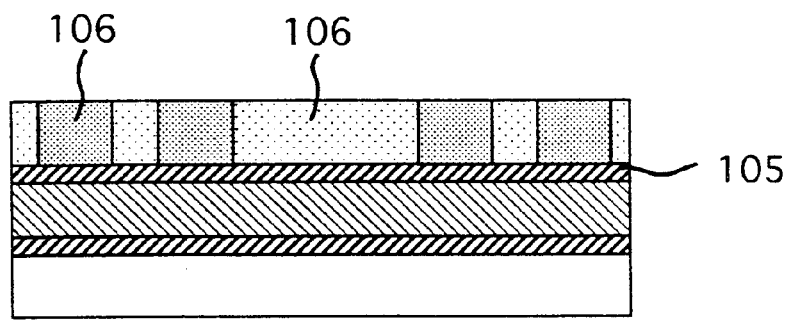

Then, as shown in FIG. 2D, resist 106 is coated on the SiN film 105. Then, using a stepper, the resist 106 is exposed to a wiring pattern.

Figure 2E:
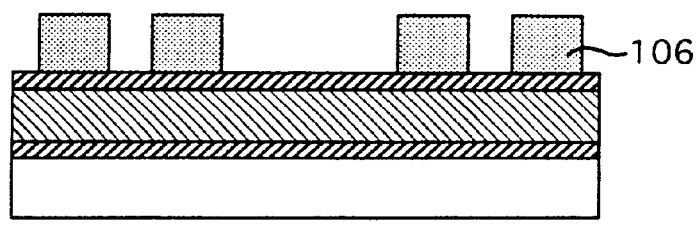

Subsequently, as shown in FIG. 2E, the resist 106 is developed, and the resist 106 formed on portions not used as the wiring is removed. Accordingly, the wiring pattern is formed in the resist 106.

Figure 2F:
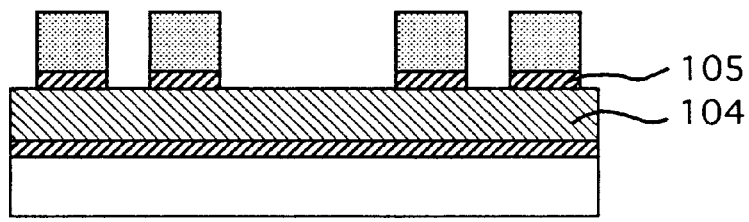

Then, as shown in FIG. 2F, the SiN film 105 is selectively etched by using the patterned resist 106 as a mask, and a pattern of the SiN film 105 is formed. This etching is carried out by means of dry etching such as plasma etching or the like.

Figure 2G:
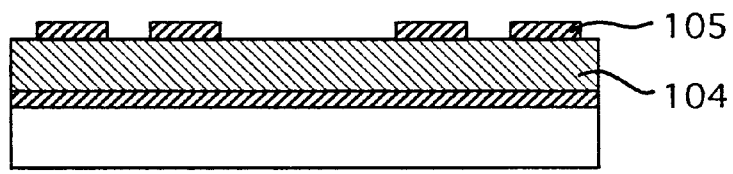

Subsequently, as shown in FIG. 2G, the resist 106 remaining on the patterned SiN film 105 is removed by ashing that uses an O$_2$ plasma or the like. As a result, only the patterned SiN film is left on the aluminum film 104.

Figure 2H:
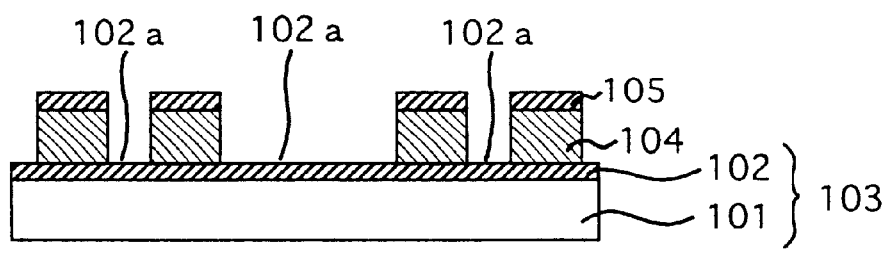

Then, as shown in FIG. 2H, the aluminum film 104 is selectively etched by using the patterned SiN film 105 as a mask, and a wiring pattern of the aluminum film is formed. This etching is carried out by means of dry etching such as plasma etching or the like to an extent that the BPSG film 102 formed under the aluminum film 104 is not removed.

Figure 2I:
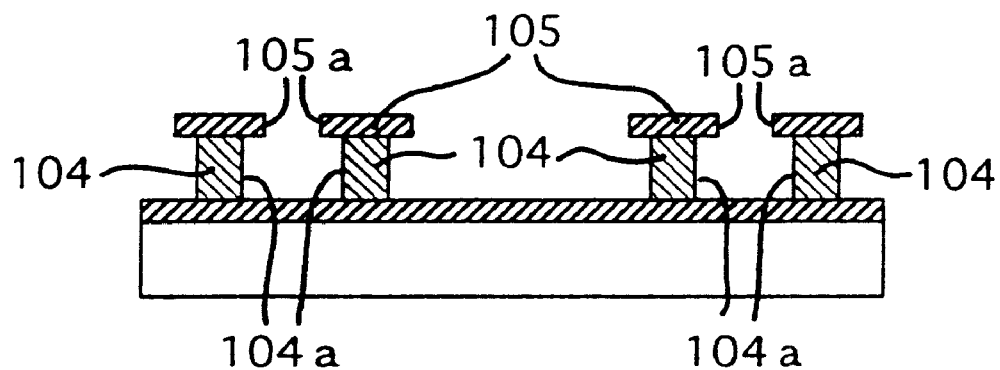

Subsequently, as shown in FIG. 2I, the aluminum film 104 formed under the SiN film 105 is subjected to side etching. In this way, a side portion 104a of the aluminum film 104 is selectively etched, and an overhung portion 105a of the SiN film 105 is formed.

The side etching is carried out by means of dry etching that uses a chlorine gas as a reaction gas. The use of the chlorine gas causes chlorine atoms to contact the side wall of the patterned aluminum film 104. Thus, corrosion occurs at the side wall, and the etching advances in a transverse direction. As a result, isotropic etching can be performed, and side etching can be performed for the aluminum film 104.

Alternatively, instead of the dry etching using the chlorine gas, wet etching using hot phosphoric acid liquid can be used to for side etching of the aluminum film 104.

In such dry etching using a chlorine gas or wet etching using hot phosphoric acid liquid, in addition to etching of the side wall of the aluminum film 104, side etching also progresses to a certain extent on a side wall of the SiN film 105. To obtain a SiN film 105 which can resist side etching as much as possible, the inventors of the present application discovered the following conditions for formation of the SiN film 105:

flow rate ratio SiH$_4$/NH$_3$ of SiH$_4$ and NH$_3$ in the source gas should be larger than 1.0.

temperature of the wafer (substrate) during film-formation should be high.

power of the high-frequency voltage (RF) during film-formation should be great.

By forming the SiN film 105 under the above conditions, it is possible to prevent the progress of side etching of the side wall of the SiN film, 105.

Figure 2J:
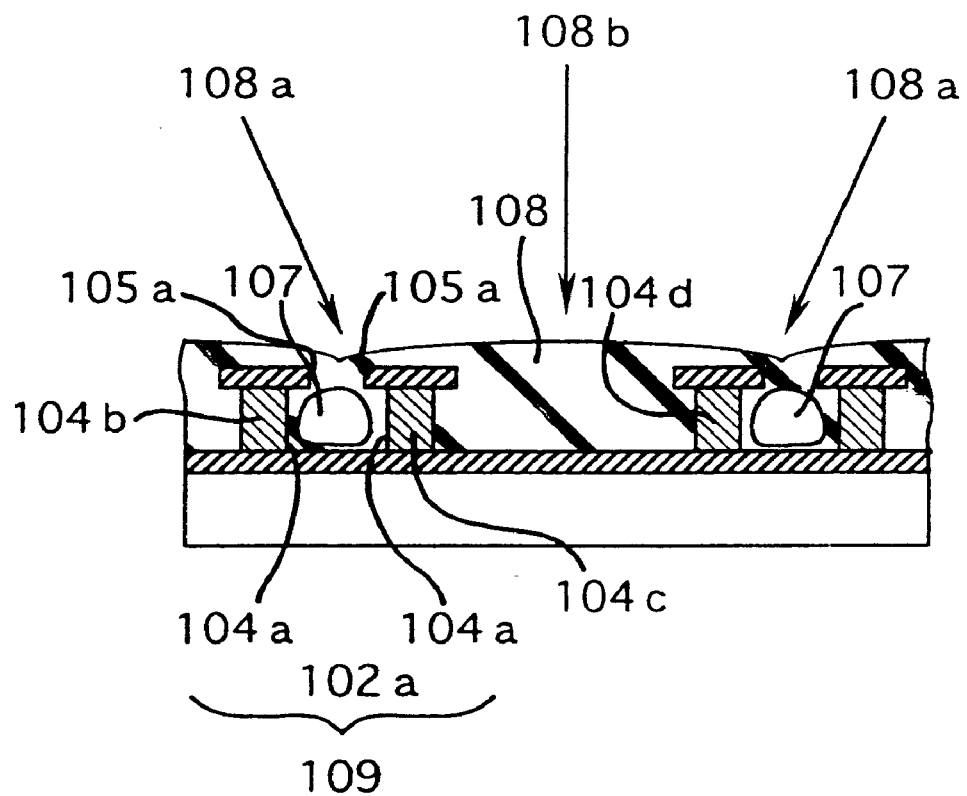

Then, as shown in FIG. 2J, an SiO$_2$ film 108 (second insulating film) is formed on the SiN film 105. This SiO$_2$ film 108 is formed by a generally used process for forming an SiO$_2$ film, for example, a Low Pressure Chemical Vapor Deposition method (LPCVD method) wherein SiH$_4$ and N$_2$O are used as source gases. The temperature of the wafer (substrate) during film-formation is set in a range of 700° C. to 800° C., and the chamber pressure is about 0.4 Torr.

The SiO$_2$ film 108 is formed not only on the SiN film 105, but also on the side wall 104a of the aluminum film 104 and a surface 102a of the BPSG film which is not part of the wiring pattern.

In this case, however, in the narrow spacing 109 between wirings defined by the side surfaces 104a of two adjacent wirings (104b and 104c) and the surface 102a of the BPSG film is never filled with the $SiO_2$ film 108, and a cavity 107 is formed. This problem can be attributed to the fact that the overhang portion 105a of the previously formed SiN film 105 prevents sufficient entry of source gases ($SiH_4$ and $NH_3$) into the space 109, and the $SiO_2$ film 108 is not sufficiently formed in the space 109.

As can be understood from the foregoing, compared with the conventional case of using the usual $SiO_2$ film as an interlayer insulating film, wiring capacitance in the narrow gap 108a between wirings can be reduced. That is, the $SiO_2$ film 108 of the present invention has a cavity 107 in the narrow space 109 between wirings. Accordingly, the dielectric constant of the $SiO_2$ film 108 in the space 109 is smaller than a like portion having no cavities. As a result, the wiring capacitance in the gap 108a is reduced as compared with the conventional case.

Since such wiring capacitance in the gap 108a of the narrow space between wirings greatly affects operating speed of a semiconductor device such as LSI, by using a film like the $SiO_2$ film 108 of the present invention having the cavity therein, the operating speed can be made faster compared with the conventional case.

In a wide space between wirings 104c and 104d, like portion 108b, no cavities are formed in the $SiO_2$ film 108. This is because sufficient source gases ($SiH_4$ and $NH_3$) enter between the wirings 104c and 104d, and thereby the $SiO_2$ film 108 is sufficiently formed. However, wiring capacitance in such a portion having a wide wiring spacing is originally small. Thus, the use of a conventional $SiO_2$ film having no cavity does not affect the operating speed of the semiconductor device such as LSI or the like.

As described above, the $SiO_2$ film 108 is formed by a conventional process for forming the $SiO_2$ film. The $SiO_2$ film 108 formed by this process does not pose the problems described above in the background art, i.e., poor stability in thermal annealing as shown by a HSQ film, and the problem of poor adhesion to an $SiO_2$ film as is offered by the Teflon group polymers. Moreover, the $SiO_2$ film does not pose the problem of film damage by $O_2$ ashing, which is seen with the organic polymer group.

In this embodiment, the $SiO_2$ film 108 is formed on the SiN film 105. But instead of the $SiO_2$ film 108, a PSG film or an FSG film can be formed. Furthermore, in this embodiment, the aluminum film 104 is used as a wiring film. But instead of the aluminum film 104, a copper (Cu) film may be used. Since electric resistance of Cu is smaller than that of the aluminum, by using Cu for wiring internal of the semiconductor device such as LSI or the like, operating speed of the semiconductor device can be increased as compared with that in the case of using aluminum.

(2) Second Embodiment

Next, a second embodiment of the present invention will be described by referring to FIGS. 2A to 2J.

In the second embodiment, instead of the SiN film 105 used in the first embodiment, a Diamond Like Carbon (DLC) film is used as a first insulating film. Portions of the semiconductor device other than this are similar to those of the first embodiment. Thus, the drawings and the reference numerals used above with reference to the first embodiment are also used for the like portions of the second embodiment, and descriptions thereof will be omitted.

In the first embodiment, the dielectric constant of the entire film laminate of the SiN film 105 and the $SiO_2$ film 108 depends naturally on the dielectric constant of the SiN film 105. In other words, when the dielectric constant of the SiN film 105 is high, the dielectric constant of the entire film laminate becomes high. When the dielectric constant of the SiN film 105 is low, the dielectric constant of the entire film laminate also becomes low. Thus, to further reduce the dielectric constant of the entire film laminate, a film having a dielectric constant lower than that of the SiN film 105 should be used instead of the SiN film 105.

The dielectric constant of the SiN film 105 was about 7.0, and the present inventors focused attention on a DLC film as one having a dielectric constant lower than 7.0. The DLC film is an amorphous carbon thin film mainly formed by sp3 bonds. Methods for forming the DLC film are well known in the art. These methods are disclosed, for example, onS. Matsumoto, Y. Sato, M. Tsutsumi and N. Setaka: J. Mat. Sci. 17, 3106 (1982), M. Nunotani, M. Komori, M. Yamasawa, Y. Fujiwara, K. Sakata, T. Kobayashi, S. Nakashima, S. Minomo, M. Tanigiichi and M. Sugiyo: Jpn. J. Appl. Phys. 30, L1199 (1991), and S. Matsumoto and Y. Matsui: J. Mat. Sci. 18, 1785 (1983).

Since its dielectric strength is as high as $10^6$V/cm, the DLC film is appropriate for an insulating film. In addition, the DLC film is stable physically and chemically. Accordingly, during side etching of the side portion 104a of the aluminum film 104, the DLC film is hardly side etched. As a result, the overhang portion 105a of the DLC film can be easily formed, and the cavity 107 can also be easily formed.

The dielectric constant of the DLC film varies depending on sizes or the number of air bubbles formed in the film. According to the measurement carried out by the present inventors, when there were relatively many air bubbles in the film, the dielectric constant of the DLC film was 2.4 to 2.7. This value is much smaller than that (about 7.0) of the SiN film.

Apparently, by using the DLC film instead of the SiN film 105 of the first embodiment, an interlayer insulating film having a dielectric constant much lower than that of the first embodiment can be formed. In other words, the dielectric constant of the entire film laminate of the DLC film and the $SiO_2$ film 108 becomes lower than that of the entire film laminate combining the SiN film 105 with the $SiO_2$ film 108.

Furthermore, since the cavities are formed inside the $SiO_2$ film 108, the dielectric constant of the $SiO_2$ film 108 becomes lower than that of the usual $SiO_2$ film as in the case of the first embodiment. Also, as described in the first embodiment, the problems inherent in the conventional low dielectric constant film (HSQ film, film of a Teflon group or other organic polymer) never occur in the $SiO_2$ film 108. Moreover, a PSG film or a FSG film can be used instead of the $SiO_2$ film 108, and a Cu film can be used instead of the aluminum film 104, as described in the first embodiment.

Although preferred embodiments of the present invention have been described in detail, it should be understood that various changes, substitutions and alternations can be made therein without departing from spirit and scope of the invention as defined by the appended claims.

What is claimed is:

1. A method for forming an interlayer insulating film, comprising the steps of:

forming a metal film on a substrate;

forming a first insulating film on the metal film;

patterning the first insulating film by selectively etching the first insulating film;

patterning the metal film to form spaced wirings by etching the metal film using the patterned first insulating film as a mask;

forming overhang portions of the first insulating film overhanging the metal film by selectively etching side walls of the metal film; and forming a second insulating film coating said side walls and partially filling spaces between facing side walls of adjacent wirings, with a cavity in the second insulating film approximately centered between and spaced from said facing side walls.

2. A method for forming an interlayer insulating film according to claim 1, wherein said first insulating film is a DLC (Diamond Like Carbon) film.

3. A method for forming an interlayer insulating film according to claim 1, wherein said second insulating film is a film selected from the group consisting of $SiO_2$ films, PSG films and FSG films.

4. A method for forming an interlayer insulating film according to claim 1, wherein said metal film is an aluminum film or a copper (Cu) film.

5. A method for forming an interlayer insulating film according to claim 4, wherein said selective etching of the side walls of the metal film, included in the step of forming the overhang portions of. the first insulating film, is by plasma etching with a chlorine-containing reaction gas or wet etching with liquid phosphoric acid.

6. A method for forming an interlayer insulating film according to claim 1, wherein said first insulating film is a film selected from the group consisting of SiN films and $SiO_2$ films.

7. A method for forming an interlayer insulating film according to claim 6, wherein said $SiO_2$ film is formed by a plasma enhanced Chemical Vapor Deposition method using a gas containing $SiH_4$ and $O_2$ as a source gas, or a plasma enhanced Chemical Vapor Deposition method using a gas containing $SiH_4$ and $N_2O$ as a source gas.

8. A method for forming an interlayer insulating film according to claimed 6, wherein said SiN film is formed by a plasma enhanced Chemical Vapor Deposition method using a gas containing $SiH_4$ and $NH_3$ as a source gas, or a plasma enhanced Chemical Vapor Deposition method using a gas containing $SiH_4$ and $N_2$ as a source gas.

9. A method for forming an interlayer insulating film according to claim 8, wherein the source gas has a ratio $SiH_4/NH_3$ of $SiH_4$ to $NH_3$ larger than 1.0.

* * * * *